US012776468B2

(12) United States Patent
Toma et al.

(10) Patent No.: US 12,776,468 B2
(45) Date of Patent: Oct. 27, 2026

(54) INSULATING STRUCTURE, ELECTROSTATIC LENS, AND CHARGED PARTICLE BEAM DEVICE

(71) Applicant: EBARA CORPORATION, Tokyo (JP)

(72) Inventors: Yasushi Toma, Tokyo (JP); Tsutomu Karimata, Tokyo (JP); Sadashi Aota, Tokyo (JP); Shinsetsu Fujisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 379 days.

(21) Appl. No.: 18/437,572

(22) Filed: Feb. 9, 2024

(65) Prior Publication Data

US 2024/0274394 A1 Aug. 15, 2024

(30) Foreign Application Priority Data

Feb. 13, 2023 (JP) ................................ 2023-019784

(51) Int. Cl.
*H01J 37/12* (2006.01)
*H01J 37/28* (2006.01)

(52) U.S. Cl.
CPC .............. *H01J 37/12* (2013.01); *H01J 37/28* (2013.01); *H01J 2237/038* (2013.01)

(58) Field of Classification Search
CPC ...... H01J 37/12; H01J 37/28; H01J 2237/038; H01J 2237/0206; H01J 37/02; H01J 37/18; H01J 37/248; H01J 37/141
See application file for complete search history.

(56) References Cited

U.S. PATENT DOCUMENTS 2,424,790 A * 7/1947 Bachman et al. .... H01J 37/065 313/313
3,617,909 A * 11/1971 Horton, Jr. .............. H01J 37/12 313/481

(Continued)

FOREIGN PATENT DOCUMENTS

CN 104715987 A 6/2015
CN 118486574 A * 8/2024 .............. H01J 37/02

(Continued)

OTHER PUBLICATIONS

Kyosu et al., "Vacuum Surface Flashover Characteristics of the Alumina Insulator with Different Metallized Edge Conditions", 28th International Symposium on Discharges and Electrical Insulation in Vacuum (ISDEIV), pp. 159-162. Sep. 23, 2018.

*Primary Examiner* — David A Vanore
(74) *Attorney, Agent, or Firm* — Chrisman Gallo Tochtrop LLC

(57) ABSTRACT

Provided is an insulating structure used in a vacuum for a charged particle beam device, the insulating structure including: an anode; a cathode facing the anode; and an insulator disposed between the anode and the cathode, wherein the insulator has: an insulator flat surface; and an insulator convex portion protruding from the insulator flat surface, the cathode has: a cathode flat surface; and a cathode concave portion which is recessed from the cathode flat surface and into which the insulator convex portion is fitted; the insulator flat surface and the cathode flat surface are not in contact with each other; and an outer surface of the insulator convex portion and an inner surface of the cathode concave portion are not in contact with each other.

11 Claims, 11 Drawing Sheets

(56) References Cited

U.S. PATENT DOCUMENTS

| | | | | |
|---|---|---|---|---|
| 6,818,889 | B1 * | 11/2004 | Sheehan | H01J 49/10 250/281 |
| 7,465,922 | B1 * | 12/2008 | McCord | H01J 37/28 250/311 |
| 2005/0263715 | A1 * | 12/2005 | Nakasuji | H01J 37/141 250/311 |
| 2011/0216299 | A1 | 9/2011 | Steenbrink et al. | |
| 2012/0319001 | A1 * | 12/2012 | Tsunoda | H01J 37/12 250/396 R |
| 2014/0291543 | A1 * | 10/2014 | Sato | H01J 37/3171 427/551 |
| 2017/0309438 | A1 | 10/2017 | Steenbrink et al. | |
| 2019/0295803 | A1 | 9/2019 | Hansen | |
| 2021/0151308 | A1 | 5/2021 | Killer et al. | |

FOREIGN PATENT DOCUMENTS

| | | | | | |
|---|---|---|---|---|---|
| EP | 0769799 | A2 | * | 4/1997 | H01J 37/244 |
| EP | 2019413 | A1 | * | 1/2009 | H01J 37/145 |
| EP | 3971941 | A1 | * | 3/2022 | H01R 13/533 |
| EP | 4343811 | A1 | * | 3/2024 | H01J 37/065 |
| EP | 4415020 | A2 | * | 8/2024 | H01J 37/02 |
| JP | H02-253548 | A | | 10/1990 | |
| JP | H08-124514 | A | | 5/1996 | |
| JP | 2003215067 | A | * | 7/2003 | H01J 37/3005 |
| JP | 4261806 | B2 | * | 4/2009 | H01J 37/241 |
| JP | 2010-129356 | A | | 6/2010 | |
| JP | 2012-504843 | A | | 2/2012 | |
| JP | 2017204342 | A | * | 11/2017 | |
| KR | 10-2012-0126462 | A | | 11/2012 | |
| WO | WO-2021001383 | A1 | * | 1/2021 | H01J 37/073 |
| WO | WO-2022244054 | A1 | * | 11/2022 | H01J 37/065 |

* cited by examiner

28

100

100

400

400

200

300

400

INSULATING STRUCTURE, ELECTROSTATIC LENS, AND CHARGED PARTICLE BEAM DEVICE

CROSS-REFERENCE TO RELATED APPLICATIONS

This application claims the benefit of Japanese Priority Patent Application JP 2023-19784 filed on Feb. 13, 2023, the entire contents of which are incorporated herein by reference.

FIELD

The present invention relates to an insulating structure, an electrostatic lens, and a charged particle beam device.

BACKGROUND

A charged particle beam device includes an electrostatic lens to which a high voltage is applied in order to control a trajectory of charged particles in a vacuum. The electrostatic lens has an insulating structure in which an insulator is disposed between an anode and a cathode. In a case where discharge occurs when a high voltage is applied between the anode and the cathode, desired performance may not be obtained.

The problem that may occur due to the occurrence of the discharge is not limited to the electrostatic lens in the charged particle beam device, and also applies to the entire insulating structure.

SUMMARY

[1] According to one embodiment, provided is an insulating structure (300) used in a vacuum for a charged particle beam device, the insulating structure comprising:

an anode (310); a cathode (320) facing the anode; and an insulator (330) disposed between the anode and the cathode, wherein the anode (310) has an anode flat surface (311) in contact with the insulator (330), the cathode (320) has:

a first cathode flat surface (322) that is substantially parallel to the anode flat surface (311) and has a first distance from the anode flat surface (311);

a second cathode flat surface (321) that is substantially parallel to the anode flat surface (311), and has a second distance from the anode flat surface (311), the second distance being smaller than the first distance; and a cathode connection surface (323) that connects the first cathode flat surface (322) and the second cathode flat surface (321), and the insulator (330) has:

a first insulator flat surface (331) in contact with the anode flat surface (311);

a second insulator flat surface (332) in contact with the first cathode flat surface (322) between the anode flat surface (311) and the first cathode flat surface (322);

a third insulator flat surface (333) between the anode flat surface (311) and the second cathode flat surface (321), having a third distance from the anode flat surface (311), the third distance being smaller than the second distance, and not in contact with the second cathode flat surface (321);

a first insulator connection surface (334) that connects the second insulator flat surface (332) and the third insulator flat surface (333) but is not in contact with the cathode (320); and a second insulator connection surface (335) located inside an outer peripheral end of the anode (310) and an outer peripheral end of the cathode (320) and connecting the first insulator flat surface (331) and the third insulator flat surface (333).

[2] In the insulating structure according to [1], the third insulator flat surface (333) may be flat from the first insulator connection surface (334) to the second insulator connection surface (335).

[3] According to one embodiment, provided is an insulating structure (300) used in a vacuum for a charged particle beam device, the insulating structure (300) comprising:

an anode (310); a cathode (320) facing the anode (310); and an insulator (330) disposed between the anode (310) and the cathode (320), wherein the insulator (330) has:

an insulator flat surface (333); and an insulator convex portion (330A) protruding from the insulator flat surface (333), the cathode (320) has:

a cathode flat surface (321); and a cathode concave portion (320A) which is recessed from the cathode flat surface (321) and into which the insulator convex portion (330A) is fitted;

the insulator flat surface (333) and the cathode flat surface (321) are not in contact with each other; and an outer surface of the insulator convex portion (330A) and an inner surface of the cathode concave portion (320A) are not in contact with each other.

[4] According to one embodiment, provided is an insulating structure (400) used in a vacuum for a charged particle beam device, the insulating structure (400) comprising:

an anode (410); a cathode (420) facing the anode; and an insulator (430) disposed between the anode (410) and the cathode (420), wherein the anode (410) has an anode flat surface (411) in contact with the insulator (430), the cathode (420) has:

a first cathode flat surface (423) that is substantially parallel to the anode flat surface (411) and has a first distance from the anode flat surface (411);

a second cathode flat surface (422) that is substantially parallel to the anode flat surface (411) and has a second distance from the anode flat surface (411), the second distance being smaller than the first distance;

a third cathode flat surface (421) that is substantially parallel to the anode flat surface (411) and has a third distance from the anode flat surface (411), the third distance being smaller than the first distance and larger than the second distance;

a first cathode connection surface (425) connecting the first cathode flat surface (423) and the second cathode flat surface (422); and a second cathode connection surface (424) connecting the second cathode flat surface (422) and the third cathode flat surface (421), and the insulator (430) has:

a first insulator flat surface (431) in contact with the anode flat surface (411);

a second insulator flat surface (432) in contact with the first cathode flat surface (423) between the anode flat surface (411) and the first cathode flat surface (423);

a third insulator flat surface (433) between the anode flat surface (411) and the second cathode flat surface (422), having a fourth distance from the anode flat surface (411), the fourth distance being smaller than the second distance, and not in contact with the second cathode flat surface (422);

a fourth insulator flat surface (434) between the anode flat surface (411) and the third cathode flat surface (421), having a fifth distance from the anode flat surface, (411) the fifth distance being smaller than the third distance, and not in contact with the third cathode flat surface (421);

a first insulator connection surface (435) that connects the second insulator flat surface (432) and the third insulator flat surface (433) but is not in contact with the cathode (420);

a second insulator connection surface (436) that connects the third insulator flat surface (433) and the fourth insulator flat surface (434) but is not in contact with the cathode (420); and a third insulator connection surface (437) located inside an outer peripheral end of the anode (410) and an outer peripheral end of the cathode (420) and connecting the first insulator flat surface (431) and the fourth insulator flat surface (434).

[5] According to one embodiment, provided is an insulating structure (400) used in a vacuum for a charged particle beam device, the insulating structure (400) comprising:

an anode (410); a cathode (420) facing the anode; and an insulator (430) disposed between the anode and the cathode, wherein the cathode (420) has:

a cathode concave portion (420A); and a cathode convex portion (420B) provided on an outer side of the cathode concave portion (420A), the insulator (430) has:

an insulator convex portion (430A);

an insulator concave portion (430B) provided on an outer side of the insulator convex portion (430A); and an insulator protruding portion (430C) provided on an outer side of the insulator concave portion (430B), the insulator convex portion protrudes (430A) toward the cathode concave portion (420A), and a top surface of the insulator convex portion (430A) is in contact with a bottom surface of the cathode concave portion (420), the cathode convex portion (420B) protrudes toward the insulator concave portion (430B) but is not in contact with the insulator (430), and the insulator convex portion (430C) protrudes toward the cathode (420) but is not in contact with the cathode (420).

[6] According to one embodiment, provided is an insulating structure (200) used in a vacuum for a charged particle beam device, the insulating structure (200) comprising:

an anode (210); a cathode (220) facing the anode; and an insulator (230) disposed between the anode and the cathode, wherein the anode (210) has an anode flat surface (211) in contact with the insulator (230), the cathode (220) has:

a first cathode flat surface (222) that is substantially parallel to the anode flat surface (211) and has a first distance from the anode flat surface (211);

a second cathode flat surface (221) that is substantially parallel to the anode flat surface (211) and has a second distance from the anode flat surface (211), the second distance being larger than the first distance; and a cathode connection surface (223) that connects the first cathode flat surface (222) and the second cathode flat surface (221), and the insulator (230) has:

a first insulator flat surface (231) in contact with the anode flat surface (211);

a second insulator flat surface (232) in contact with the first cathode flat surface (222) between the anode flat surface (211) and the first cathode flat surface (222);

a third insulator flat surface (233) between the anode flat surface (211) and the second cathode flat surface (221), having a third distance from the anode flat surface (221), the third distance being larger than the first distance and smaller than the second distance, and not in contact with the second cathode flat surface (221);

a first insulator connection surface (234) that connects the second insulator flat surface (232) and the third insulator flat surface (233) but is not in contact with the cathode (230); and a second insulator connection surface (235) located inside an outer peripheral end of the anode (210) and an outer peripheral end of the cathode (220) and connecting the first insulator flat surface (231) and the third insulator flat surface (233).

[7] According to one embodiment, provided is an insulating structure (200) used in a vacuum for a charged particle beam device, the insulating structure (200) comprising:

an anode (210); a cathode (220) facing the anode (210); and an insulator (230) disposed between the anode (210) and the cathode (220), wherein the cathode (220) has:

a cathode flat surface (221); and a cathode convex portion (220A) protruding from the cathode flat surface(221), the insulator (230) has:

an insulator flat surface (233); and an insulator concave portion (230A) that is recessed from the insulator flat surface (233) and into which the cathode convex portion (220A) is fitted, the cathode flat surface (221) and the insulator flat surface (233) are not in contact with each other, and an outer surface of the cathode convex portion (220A) and an inner surface of the insulator concave portion (230A) are not in contact with each other.

[8] In the insulating structure according to any one of [1] to [7], the insulator may be made of PEEK.

[9] In the insulating structure according to any one of [1] to [8], at least a part of a surface of the insulator in contact with the anode may be metallized.

[10] According to one embodiment, provided is an electrostatic lens comprising: the insulating structure according to any one of [1] to [9].

[11] According to one embodiment, provided is a charged particle beam device comprising: the electrostatic lens according to [10].

DETAILED DESCRIPTION

Hereinafter, an embodiment according to the present invention will be specifically described with reference to the drawings.

Figure 1A:
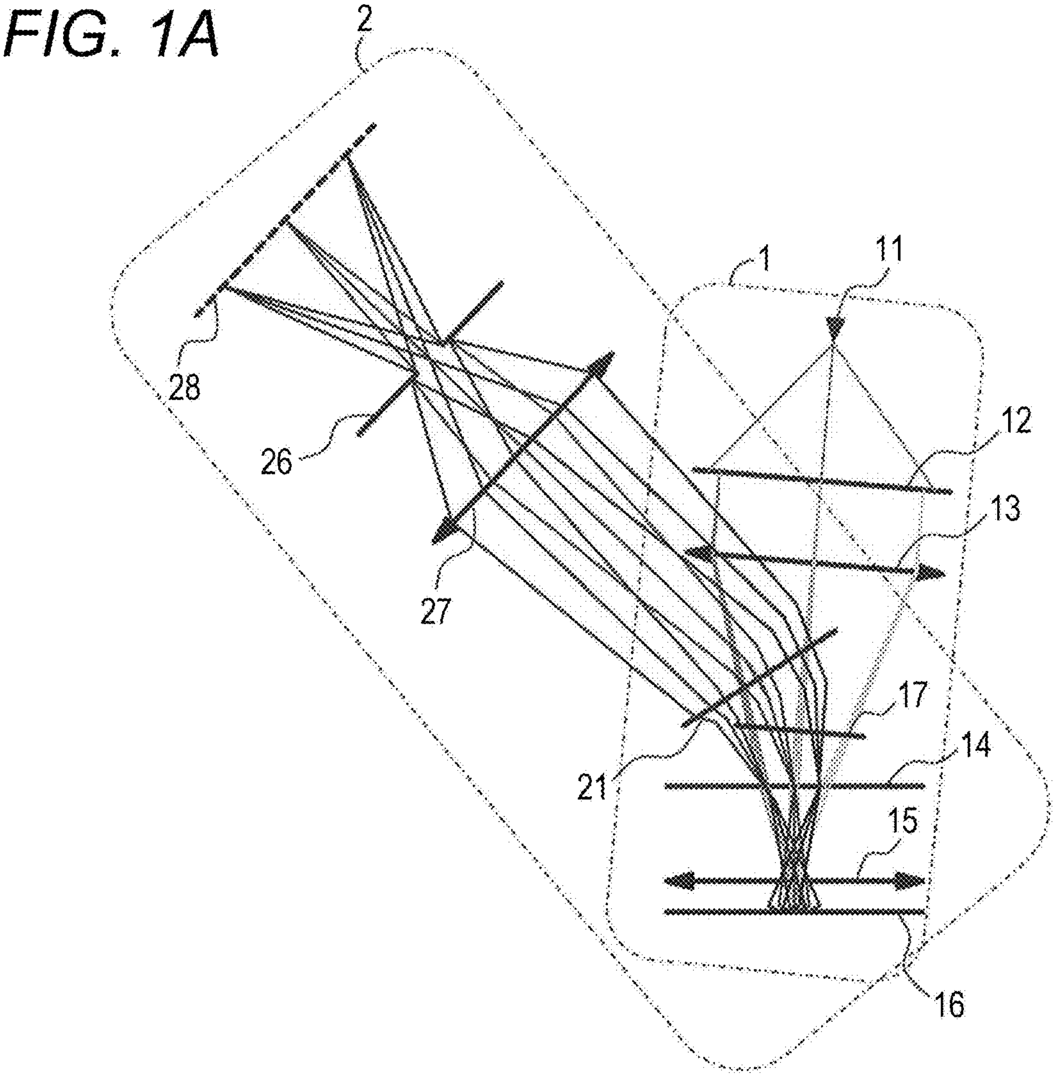
FIG. 1A is a schematic diagram of a scanning electron microscope which is an example of a charged particle beam device.

FIG. 1A is a schematic diagram of a scanning electron microscope (SEM) which is an example of a charged particle beam device. The scanning electron microscope includes a primary optical system 1 (irradiation system) and a secondary optical system 2 (imaging system), which are disposed in a vacuum column (not illustrated).

The primary optical system 1 focuses and emits a primary electron beam (charged particles) including a plurality of primary electrons to a plurality of places of a sample placed on a stage 16, and includes an electron source 11, a multiple beam generation mechanism 12, a transfer lens 13, a beam separator 14, an objective lens 15, a stage 16, a scan deflector 17, and the like.

The electron beam emitted from the electron source 11 is appropriately accelerated by an accelerator (not illustrated) and expanded by a lens (not illustrated), and is incident on the multiple beam generation mechanism 12. The multiple beam generation mechanism 12 has a plurality of openings, and the electron beam from the electron source 11 passes through these openings to generate a primary electron beam including a plurality of primary electrons. The generated primary electron beam is individually focused by the transfer lens 13, the beam separator 14, and the objective lens 15, and a plurality of places of the sample placed on the stage 16 are irradiated with the primary electron beam discretely at equal intervals.

In addition, the primary electron beam is deflected by the scan deflector 17 so as to scan the sample two-dimensionally. As a result, the sample is uniformly irradiated with the primary electron beam emitted discretely.

The secondary optical system 2 detects a secondary electron beam including a plurality of secondary electrons emitted from the sample irradiated with the primary electron beam by the detector 28, and includes an objective lens 15, a beam separator 14, a beam bender 21, a projection lens 27, an aperture diaphragm 26, a detector 28, and the like. The objective lens 15 and the beam separator 14 are shared with the primary optical system 1.

The secondary electron beam from the sample is focused by the objective lens 15. Then, the secondary electron beam is bent in a direction different from that of the primary optical system 1 by the beam separator 14 forming a superimposed field of an electric field and a magnetic field. The secondary electron beam is further bent by the beam bender 21.

The secondary electron beam is brought close to the vicinity of the optical axis by the projection lens 27. The aperture diaphragm 26 is disposed at a position where a plurality of secondary electrons are closest to each other in the optical axis center.

The aperture diaphragm 26 has an opening portion, and only the secondary electron beam that has passed through the opening portion reaches the projection lens 27. As a result, an opening angle of the secondary electron beam is defined.

Figure 1B:
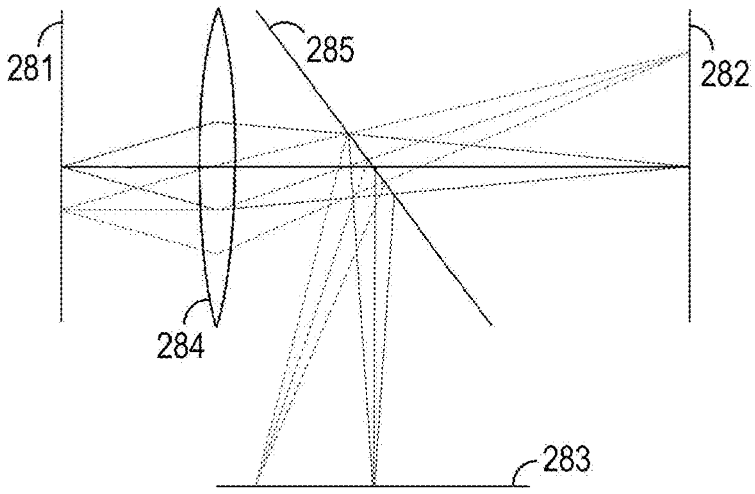
FIG. 1B is a diagram illustrating a configuration example of a detector.

As illustrated in FIG. 1B, the detector 28 includes, for example, a scintillator 281, an optical amplifier 282, an image sensor 283 (for example, a CMOS image sensor), a magnifying lens 284, and a half mirror 285.

Secondary electrons emitted from a plurality of places on the sample are imaged on the scintillator 281, and light corresponding to the quantity of secondary electron beams reaching the scintillator 281 is generated from the scintillator 281. Since the generated light is divergent light, the light is enlarged and projected using the magnifying lens 284 disposed in the optical path. A part of the light having passed through the magnifying lens 284 passes through the half mirror 285 and travels toward the optical amplifier 282 via a bundle of optical fibers, and a part of the light is reflected by the half mirror 285 and travels toward the image sensor 283. The former light is converted into an electric signal by the optical amplifier 282, and scanning images (SEM images) of the number of beams corresponding to the quantity of secondary electron beams are formed. The latter light forms an image on the image sensor 283, and an image by the secondary electron beam is obtained.

In such a charged particle beam device such as a scanning electron microscope, an electrostatic lens is used as the transfer lens 13, the objective lens 15, the projection lens 27, the magnifying lens 284, and the like. The electrostatic lens has an insulating structure in which an insulator is disposed between an anode and a cathode, but in a case where discharge occurs when a high voltage is applied, resolution of an electron image or analysis may be deteriorated.

As the insulator, an organic material (engineering plastics such as poly ether ether ketone (PEEK), for example) that is cheaper than alumina and glass and has a low dielectric constant may be used.

In this case, when discharge occurs, insulation characteristics of the organic material may be deteriorated by the current generated due to the discharge.

Figure 2:
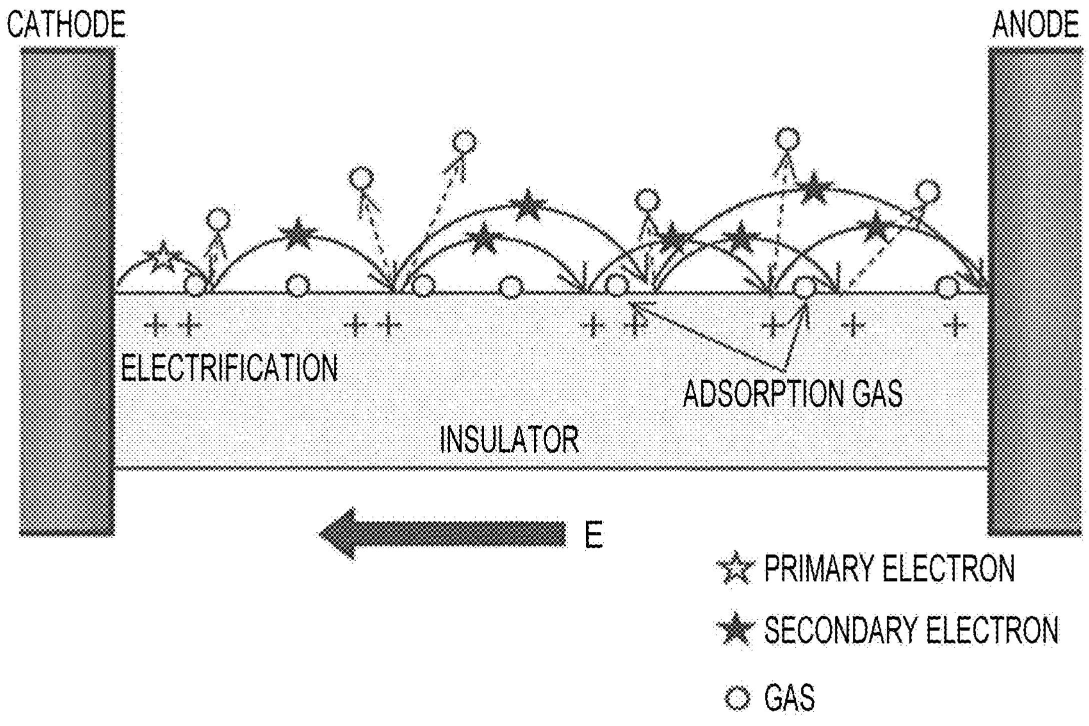
FIG. 2 is a diagram for describing a mechanism in which creeping discharge occurs in an insulating structure including an anode, a cathode, and an insulator.

A particular problem of discharge in a vacuum is creeping discharge in which electrons are transmitted through the surface of the insulator. A mechanism in which creeping discharge occurs in an insulating structure including an anode, a cathode, and an insulator will be described with reference to FIG. 2.

When the electric field is strengthened in a region where a cathode, an insulator, and a vacuum overlap (cathode triple junction, hereinafter referred to as "CTJ"), primary electrons are emitted by field electron emission (start stage).

The emitted primary electrons collide on the surface of the insulator to generate secondary electrons. As the secondary electrons further collide on the surface of the insulator, the secondary electrons are multiplied. Such secondary electrons move from the cathode to the anode. Thereby, desorption of an adsorption gas on the surface of the insulator is promoted (progress stage). Then, discharge occurs in the adsorption gas desorbed from the surface of the insulator (breakdown stage).

In order to suppress such creeping discharge, the inventors performed electric field analysis on the following four insulating structures.

Figure 3A:
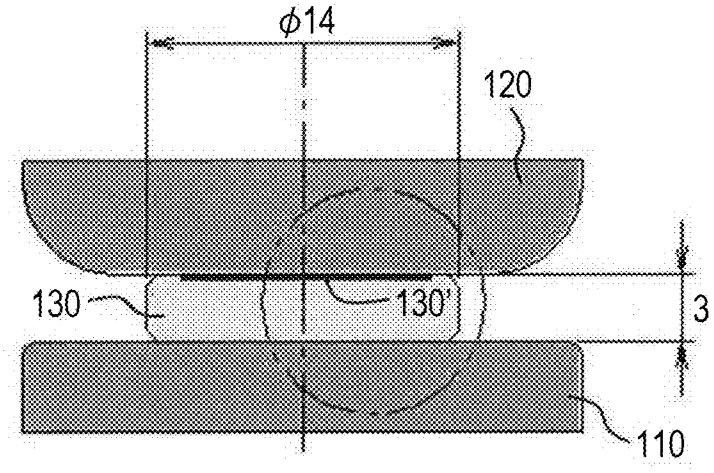
FIG. 3A is a cross-sectional diagram of a first insulating structure.
Figure 3B:
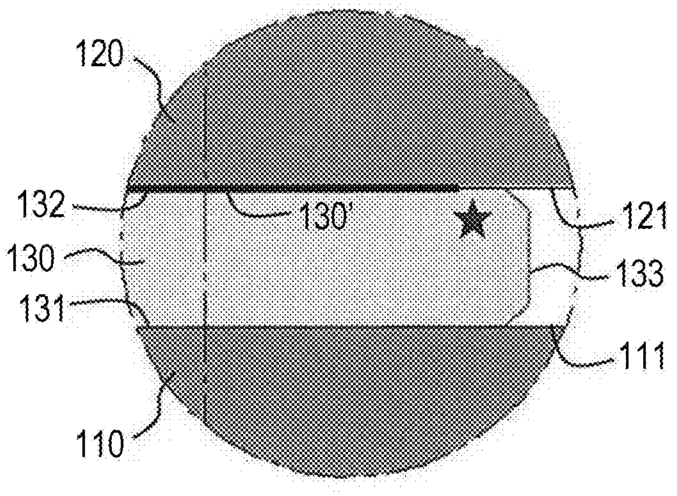
FIG. 3B is an enlarged diagram of a one-dot chain line portion in FIG. 3A.

FIGS. 3A and 3B are a cross-sectional diagram of the first insulating structure 100 and an enlarged diagram in a one-dot chain line portion thereof, respectively. The first insulating structure 100 is a reference structure, and includes an anode 110, a cathode 120 facing the anode 110, and an insulator 130 made of PEEK disposed between the anode 110 and the cathode 120.

As illustrated in FIG. 3B, the anode 110 has a flat surface 111. The flat surface 111 is circular and its diameter is sufficiently larger than the insulator 130. Therefore, a portion of the anode 110 in contact with the insulator 130 is flat.

The cathode 120 has a flat surface 121. The flat surface 121 is circular and its diameter is sufficiently larger than the insulator 130. Therefore, a portion of the cathode 120 in contact with the insulator 130 is flat. A distance between the anode 110 and the cathode 120 is 3 mm.

The insulator 130 has a columnar shape, and has a flat surface 131 in contact with the flat surface 111 of the anode 110, a flat surface 132 in contact with the flat surface 121 of the cathode 120, and a connection surface 133 connecting the flat surfaces 131 and 132. The connection surface 133 has a cylindrical shape extending substantially in a vertical direction, but is inclined inward in the vicinity of portions in contact with the anode 110 and the cathode 120. The connection surface 133 defines an outer edge of the insulator 130, and the insulator 130 is circular with a radius (a length from a central axis of the insulator 130 to the connection surface 133) of 7 mm.

The surface of the insulator 130 in contact with the cathode 120 is metallized. Specifically, nickel plating 130' is applied to the surface of the insulator 130 made of PEEK. This can ensure electrical contact between the cathode 120 and the insulator 130 and fix the CTJ to the end face of the nickel plating 130'. The nickel plating 130' has a thickness of about 20 nm, and is applied to the inside by about 0.5 mm from an outer peripheral end (connection surface 133) of the insulator 130.

The connection surface 133 of the insulator 130 is in contact with a vacuum portion. Therefore, a position indicated by a star becomes a CTJ in which the cathode 120, the insulator 130, and the vacuum overlap.

Figure 4A:
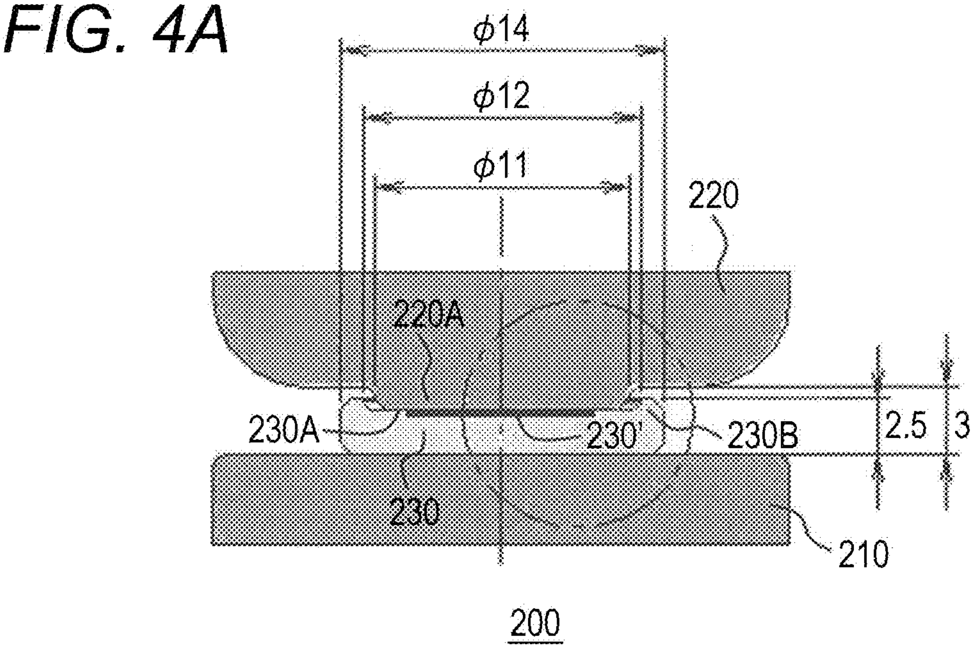
FIG. 4A is a cross-sectional diagram of a second insulating structure.
Figure 4B:
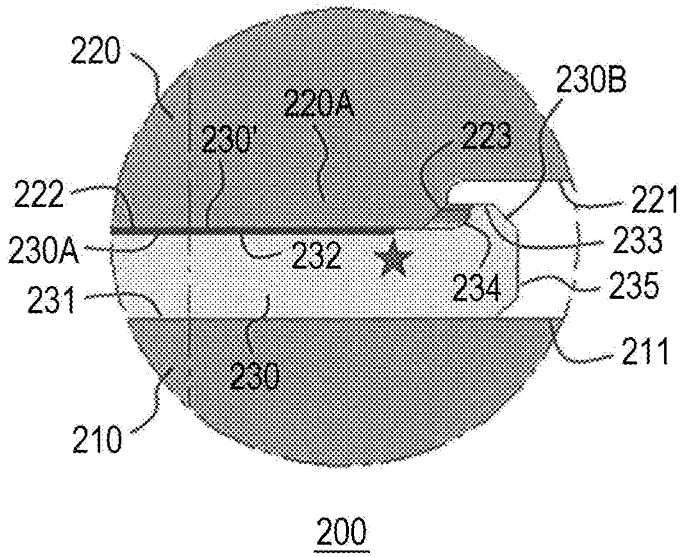
FIG. 4B is an enlarged diagram of a one-dot chain line portion in FIG. 4A.

FIGS. 4A and 4B are a cross-sectional diagram of a second insulating structure 200 and an enlarged diagram in a one-dot chain line portion thereof, respectively. The second insulating structure 200 includes an anode 210, a cathode 220 facing the anode 210, and an insulator 230 made of PEEK disposed between the anode 210 and the cathode 220. As a main difference from the first insulating structure 100, in the second insulating structure 200, the cathode 220 has a circular convex portion 220A having a diameter of 11 mm, and the insulator 230 has a circular concave portion 230A having a diameter of 12 mm, which are fitted. Note that an outer surface of the convex portion 220A and an inner surface of the concave portion 230A are not in contact with each other. Details will be described below.

As illustrated in FIG. 4B, the anode 210 has a flat surface 211. The flat surface 211 is circular and its diameter is sufficiently larger than the insulator 230. Therefore, a portion of the anode 210 in contact with the insulator 230 is flat.

The cathode 220 has flat surfaces 221 and 222 substantially parallel to the flat surface 211 of the anode 210, and a connection surface 223 connecting the flat surfaces 221 and 222. The flat surface 221 has an annular shape on the outer edge side of the cathode 220, and the flat surface 222 is circular on the inner side thereof. Assuming that distances between the flat surface 211 of the anode 210 and the flat surfaces 221 and 222 are d21 and d22, respectively, d21=3 mm, d22=2 mm, and d21>d21.

The convex portion 220A protrudes from the flat surface 221 toward the anode 210, and it can be said that a top surface of the convex portion 220A is the flat surface 222.

The insulator 230 has flat surfaces 231 to 233 and connection surfaces 234 and 235. The flat surface 231 is in contact with the flat surface 211 of the anode 210. The flat surface 232 is in contact with the flat surface 222 between the flat surface 211 of the anode 210 and the flat surface 222 of the cathode 220. The flat surface 233 is between the flat surface 211 of the anode 210 and the flat surface 221 of the cathode 210, but is not in contact with the flat surface 221. That is, assuming that the distance between the flat surface 211 of the anode 210 and the flat surface 233 of the insulator 230 is d23, d23=2.5 mm, and d22<d23<d21.

The concave portion 230A is recessed from the flat surface 233, and it can be said that a bottom surface of the concave portion 230A is the flat surface 232. It can also be said that there is an annular protruding portion 230B that is formed by the connection surface 234, the flat surface 233, and the connection surface 235 and protrudes toward the cathode 220 on an outer side of the concave portion 230A.

The connection surface 234 connects the flat surface 232 and the flat surface 233. However, the connection surface 234 is not in contact with the cathode 220. As a result, an outer surface of the convex portion 220A (that is, the connection surface 223) and an inner surface of the concave portion 230A (that is, the connection surface 234) are not in contact with each other. The connection surface 235 is located inside an outer peripheral end of the anode 210 and an outer peripheral end of the cathode 220, and connects the flat surface 231 and the flat surface 233. The connection surface 235 has a cylindrical shape extending substantially in the vertical direction, but is inclined in the vicinity of portions in contact with the anode 210 and the cathode 220. The connection surface 235 defines an outer edge of the insulator 230, and the insulator 230 is circular with a radius (a length from a central axis of the insulator 230 to the connection surface 235) of 7 mm.

The surface of the insulator 230 in contact with the cathode 220 is metallized. Specifically, nickel plating 230' is applied to the flat surface 232 of the insulator 230 from the outer peripheral end to the inside by about 0.5 mm.

The connection surface 234 of the insulator 230 is in contact with a vacuum portion. Therefore, a position indicated by a star becomes a CTJ in which the cathode 220, the insulator 230, and the vacuum overlap. The electrons generated in the vicinity of the CTJ pass between the connection surfaces 223 and 234, pass through the protruding portion 230B, and move along the connection surface 235.

Figure 5A:
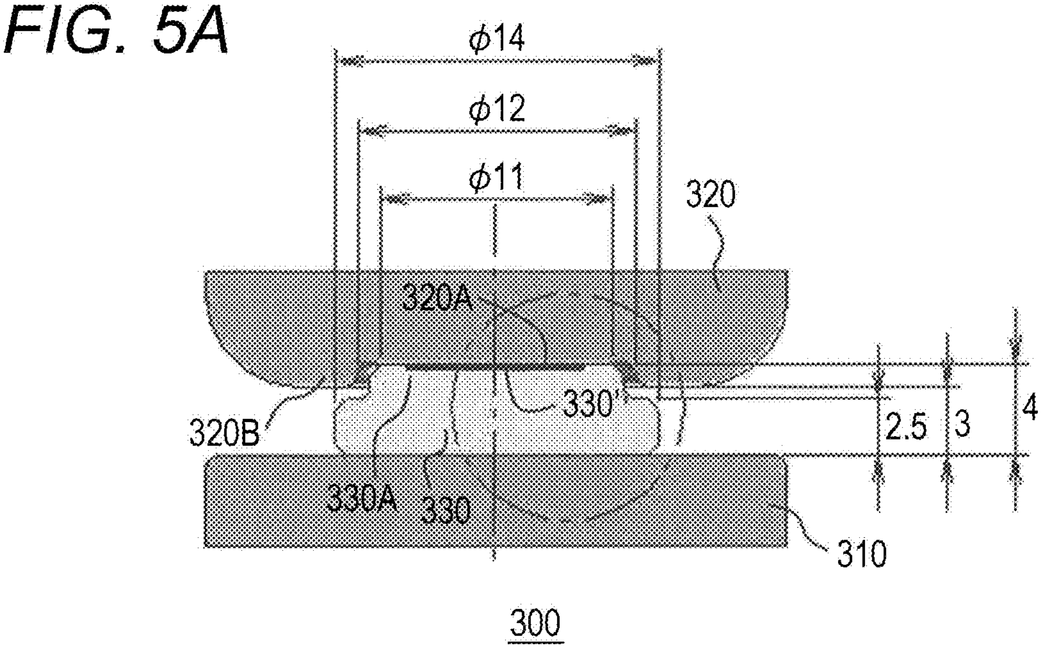
FIG. 5A is a cross-sectional diagram of a third insulating structure.
Figure 5B:
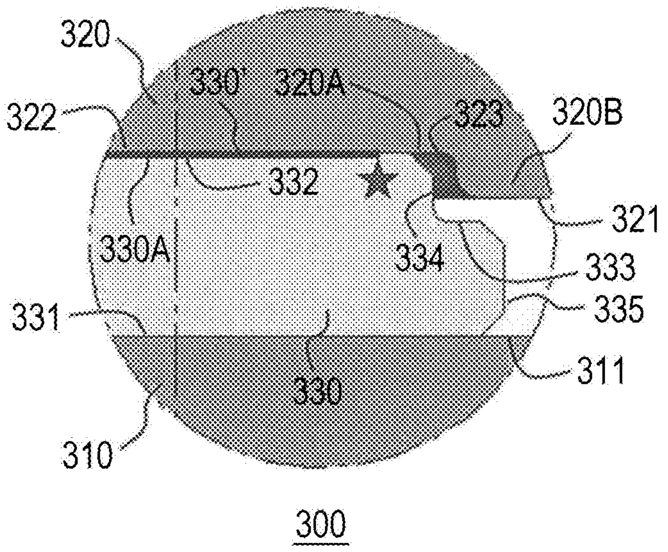
FIG. 5B is an enlarged diagram of a one-dot chain line portion in FIG. 5A.

FIGS. 5A and 5B are a cross-sectional diagram of a third insulating structure 300 and an enlarged diagram of a one-dot chain line portion thereof, respectively. The third insulating structure 300 includes an anode 310, a cathode 320 facing the anode 310, and an insulator 330 made of PEEK disposed between the anode 310 and the cathode 320. As a main difference from the first insulating structure 100, in the third insulating structure 300, the insulator 330 has a circular convex portion 330A having a diameter of 10 mm, and the cathode 320 has a circular concave portion 320A having a diameter of 12 mm, which are fitted. Note that an outer surface of the convex portion 330A and an inner surface of the concave portion 320A are not in contact with each other. Details will be described below.

As illustrated in FIG. 5B, the anode 310 has a flat surface 311. The flat surface 311 is circular and its diameter is sufficiently larger than the insulator 330. Therefore, a portion of the anode 310 in contact with the insulator 330 is flat.

The cathode 320 has flat surfaces 321 and 322 substantially parallel to the flat surface 311 of the anode 310, and a connection surface 323 connecting the flat surfaces 321 and 322. The flat surface 321 has an annular shape on the outer edge side of the cathode 320, and the flat surface 322 is circular on the inner side thereof. Assuming that distances between the flat surface 311 of the anode 310 and the flat surfaces 321 and 322 are d31 and d32, respectively, d31=3 mm, d32=4 mm, and d31<d32.

The concave portion 320A is recessed from the flat surface 321, and it can be said that a bottom surface of the concave portion 320A is the flat surface 322. It can also be said that there is an annular protruding portion 320B that is formed by the connection surface 323, the flat surface 321, and an outer peripheral surface of the cathode 320 and protrudes toward the anode 310 on an outer side of the concave portion 320A.

The insulator 330 has flat surfaces 331 to 333 and connection surfaces 334 and 335. The flat surface 331 is in contact with the flat surface 311 of the anode 310. The flat surface 332 is in contact with the flat surface 322 between the flat surface 311 of the anode 310 and the flat surface 322 of the cathode 320. The flat surface 333 is between the flat surface 311 of the anode 310 and the flat surface 321 of the cathode 320, but is not in contact with the flat surface 321. That is, assuming that the distance between the flat surface 311 of the anode 310 and the flat surface 333 of the insulator 330 is d33, d33=2.5 mm, and d33<d31<d32.

The convex portion 330A protrudes from the flat surface 333 toward the cathode 320, and it can be said that a top surface of the convex portion 330A is the flat surface 332.

The connection surface 334 connects the flat surface 332 and the flat surface 333. However, the connection surface 334 is not in contact with the cathode 320. As a result, an outer surface of the convex portion 330A (that is, the connection surface 334) and an inner surface of the concave portion 320A (that is, the connection surface 323) are not in contact with each other. The connection surface 335 is located inside an outer peripheral end of the anode 310 and an outer peripheral end of the cathode 320, and connects the flat surface 331 and the flat surface 333. The connection surface 335 has a cylindrical shape extending substantially in the vertical direction, but is inclined in the vicinity of portions in contact with the anode 310 and the cathode 320. The connection surface 335 defines an outer edge of the insulator 330, and the insulator 330 is circular with a radius (a length from a central axis of the insulator 330 to the connection surface 335) of 7 mm. The flat surface 333 is flat from an inner edge (connection surface 334) to an outer edge (connection surface 335), and is not provided with a convex portion.

The surface of the insulator 330 in contact with the cathode 320 is metallized. Specifically, nickel plating 330' is applied to the flat surface 332 of the insulator 330 from the outer peripheral end to the inside by about 0.5 mm.

The connection surface 334 of the insulator 330 is in contact with a vacuum portion. Therefore, a position indicated by a star becomes a CTJ in which the cathode 320, the insulator 330, and the vacuum overlap. The electrons generated in the vicinity of the CTJ pass between the connection surfaces 323 and 334 and move along the flat surface 333 and the connection surface 335. Since the flat surface 333 is flat, there is no convex portion in a movement path of the electron.

Figure 6A:
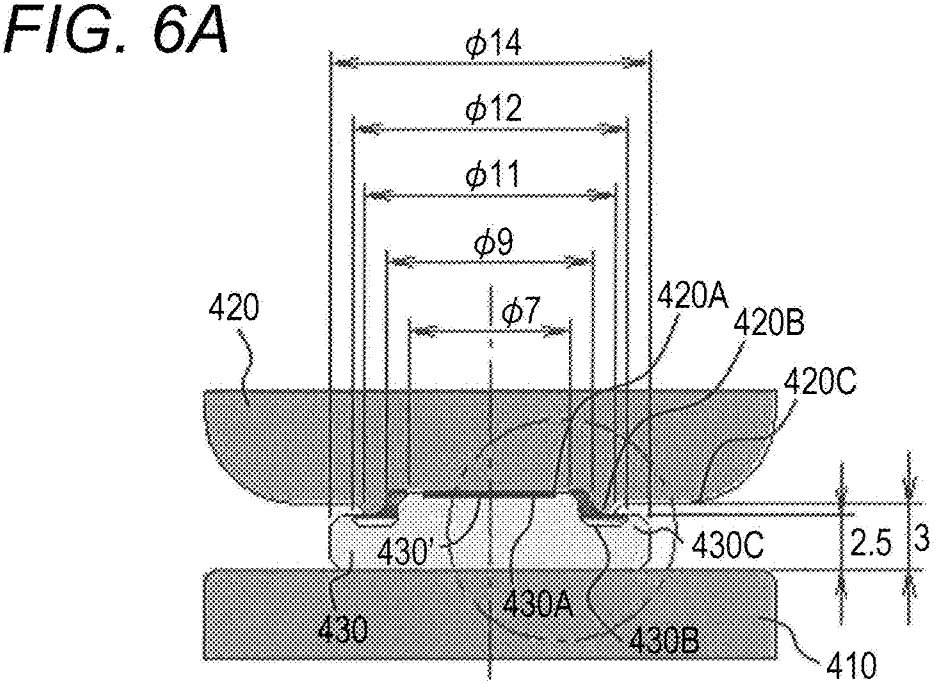
FIG. 6A is a cross-sectional diagram of a fourth insulating structure.
Figure 6B:
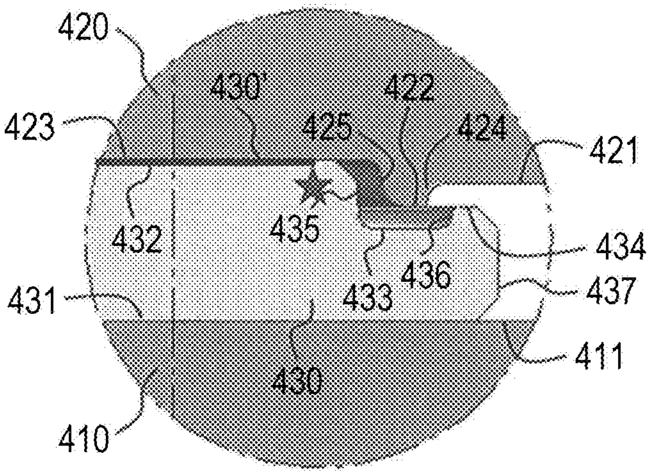
FIG. 6B is an enlarged diagram of a one-dot chain line portion in FIG. 6A.

FIGS. 6A and 6B are a cross-sectional diagram of a fourth insulating structure 400 and an enlarged diagram in a one-dot chain line portion thereof, respectively. The fourth insulating structure 400 includes an anode 410, a cathode 420 facing the anode 410, and an insulator 430 made of PEEK and disposed between the anode 410 and the cathode 420.

As a main difference from the first insulating structure 100, the cathode 420 of the fourth insulating structure 400 has a circular concave portion 420A having a diameter of 9 mm, an annular convex portion 420B having an outer diameter of 11 mm provided on an outer side of the concave portion 420A, and an annular concave portion 420C provided on an outer side of the convex portion 420B. In addition, the insulator 430 has a circular convex portion 430A having a diameter of 7 mm, an annular concave portion 430B having an outer diameter of 12 mm provided on an outer side of the convex portion 430A, and a protruding portion 430C provided on an outer side of the concave portion 430B.

The convex portion 430A of the insulator 430 protrudes toward the concave portion 420A of the cathode 420, and a top surface thereof is in contact with a bottom surface of the concave portion 420A. The convex portion 420B of the cathode 420 protrudes toward the concave portion 430B of the insulator 430, but is not in contact with the insulator 430. The protruding portion 430C of the insulator 430 protrudes toward the concave portion 420C of the cathode 420, but is not in contact with the cathode 420. Details will be described below.

As illustrated in FIG. 6B, the anode 410 has a flat surface 411. The flat surface 411 is circular and its diameter is sufficiently larger than the insulator 430. Therefore, a portion of the anode 410 in contact with the insulator 430 is flat.

The cathode 420 has flat surfaces 421 to 423 substantially parallel to the flat surface 411 of the anode 410, a connection surface 424 connecting the flat surfaces 421 and 422, and a connection surface 425 connecting the flat surfaces 422 and 423. The flat surface 421 has an annular shape on the outer edge side of the cathode 420, the flat surface 422 has an annular shape on the inner side of the flat surface 421, and the flat surface 423 is circular on the inner side of the flat surface 422. Assuming that distances between the flat surface 411 and the flat surfaces 421, 422, and 423 are d1, d2, and d3, respectively, d1=3 mm, d2=2.5 mm, and d3=3.5 mm, and d2<d1<d3.

The concave portion 420A is recessed from the flat surface 422, and it can be said that a bottom surface thereof is the flat surface 423. The convex portion 420B protrudes from the flat surface 423 and/or the flat surface 421 toward the anode 410, and it can be said that a top surface thereof is the flat surface 422. The concave portion 420C is recessed from the flat surface 422, and it can be said that the bottom surface thereof is the flat surface 421.

The insulator 430 has flat surfaces 431 to 434 and connection surfaces 435 to 437.

The flat surface 431 is in contact with the flat surface 411 of the anode 410. The flat surface 432 is in contact with the flat surface 423 between the flat surface 411 of the anode 410 and the flat surface 423 of the cathode 420. The flat surface 433 is between the flat surface 411 of the anode 410 and the flat surface 422 of the cathode 420, but is not in contact with the flat surface 422. The flat surface 434 is between the flat surface 411 of the anode 410 and the flat surface 421 of the cathode 420, but is not in contact with the flat surface 421.

The connection surface 435 connects the flat surface 432 and the flat surface 433, but is not in contact with the cathode 420. The connection surface 436 connects the flat surface 433 and the flat surface 434, but is not in contact with the cathode 420.

Since the connection surface 435, the flat surface 433, and the connection surface 436 are not in contact with the cathode 420, an outer surface of the convex portion 430A of the insulator 430 (that is, the connection surface 435) and an inner surface of the concave portion 420A of the cathode 420 (that is, the connection surface 425) are not in contact with each other. In addition, outer surfaces of the convex portion 420B of the cathode 420 (that is, the connection surfaces 424 and 425) are not in contact with inner surfaces of the concave portion 430B of the insulator 430 (that is, the connection surfaces 435 and 436). Further, an outer surface of the protruding portion 430C of the insulator 430 (that is, the connection surface 436) is not in contact with an inner surface of the concave portion 420C of the cathode 420 (that is, the connection surface 424).

The connection surface 437 is located inside an outer peripheral end of the anode 410 and an outer peripheral end of the cathode 420, and connects the flat surface 431 and the flat surface 434. The connection surface 437 has a cylindrical shape extending substantially in the vertical direction, but is inclined in the vicinity of portions in contact with the anode 410 and the cathode 420. The connection surface 437 defines an outer edge of the insulator 430, and the insulator 430 is circular with a radius (a length from a central axis of the insulator 430 to the connection surface 437) of 7 mm.

The surface of the insulator 430 in contact with the cathode 420 is metallized. Specifically, nickel plating 430' is applied to the flat surface 432 of the insulator 430 from the outer peripheral end to the inside by about 0.5 mm.

The connection surface 435 of the insulator 430 is in contact with a vacuum portion. Therefore, a position indicated by a star becomes a CTJ in which the cathode 420, the insulator 430, and the vacuum overlap. The electrons generated in the vicinity of the CTJ pass between the connection surfaces 425 and 435, further pass between the flat surfaces 422 and 433, pass through the protruding portion 430C, and move along the connection surface 437.

The discharge characteristics of the first insulating structure 100 to fourth insulating structure 400 as described above are analyzed.

Figure 7:
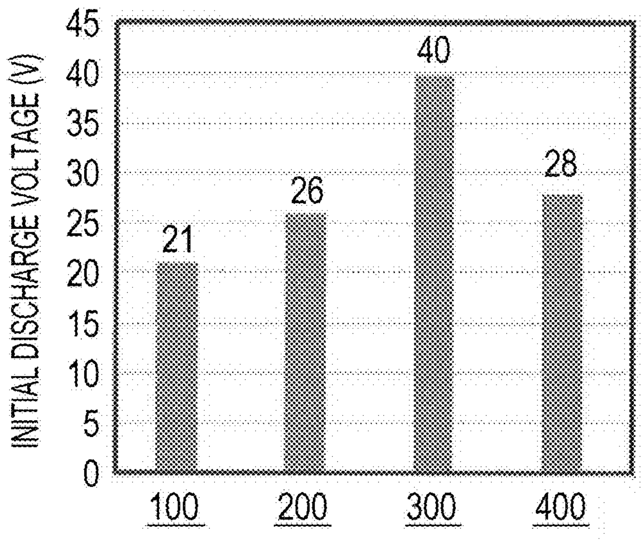
FIG. 7 is a graph illustrating initial discharge voltages of the first insulating structure to the fourth insulating structure.

FIG. 7 is a graph illustrating initial discharge voltages of the first insulating structure 100 to the fourth insulating structure 400. These initial discharge voltages are voltages at which dielectric breakdown occurs for the first time when the cathodes 110 to 410 are set as the ground voltages and the voltages applied to the anodes 120 to 420 are increased. The higher the initial discharge voltage, the better.

As illustrated, the initial discharge voltages of the second insulating structure 200, the third insulating structure 300, and the fourth insulating structure 400 are higher than the initial discharge voltage of the first insulating structure 100 which is a reference. In the second insulating structures 200 and 400, since the protruding portions 230B and 430C exist in the path of the electronic avalanche, it is considered that the electronic avalanche is suppressed and the withstand voltage is increased. In addition, it is considered that in the third insulating structure 300, since the CTJ has a shape in which the CTJ is hidden in the cathode 320, the pressure resistance is increased.

Therefore, any of the second insulating structure 200, the third insulating structure 300, and the fourth insulating structure 400 is effective when focusing on the initial discharge voltage.

Figure 8:
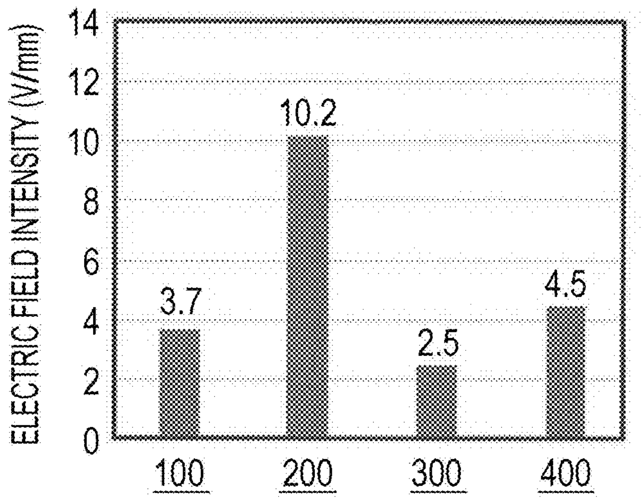
FIG. 8 is a graph illustrating CTJ electric field intensities of the first insulating structure to the fourth insulating structure.

FIG. 8 is a graph illustrating CTJ electric field intensities of the first insulating structure 100 to the fourth insulating structure 400. This CTJ electric field intensity is a result obtained by performing electric field analysis by numerical calculation assuming that the cathodes 110 to 410 are ground electrodes and 30 kV is applied to the anodes 120 to 420. The lower the CTJ electric field intensity, the better.

As illustrated, the CTJ electric field intensity of the third insulating structure 300 is lower than the CTJ electric field intensity of the first insulating structure 100 which is a reference. In the third insulating structure 300, since the CTJ has a shape in which the CTJ is hidden in the cathode 320, it is considered that the CTJ electric field intensity is lowered. In the second insulating structure 200, the CTJ electric field intensity is considered to be high because the cathode 220 has the convex portion 220A. In the fourth insulating structure 400, the CTJ electric field intensity is considered to be high because the cathode 420 has the convex portion 420B.

Therefore, the third insulating structure 300 is effective when focusing on the CTJ electric field intensity.

Figure 9:
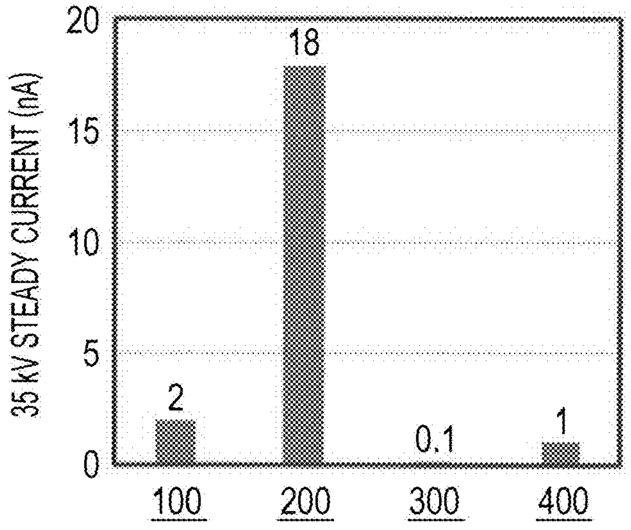
FIG. 9 is a graph illustrating 35 kV steady currents of the first insulating structure to the fourth insulating structure.

FIG. 9 is a graph illustrating 35 kV steady currents of the first insulating structure 100 to the fourth insulating structure 400. The 35 kV steady current is a result obtained by measuring a current flowing between electrodes assuming that the cathodes 110 to 410 are ground electrodes and 35 kV is applied to the anodes 120 to 420. The lower the 35 kV steady current, the better.

As illustrated, the 35 kV steady currents of the third insulating structure 300 and the fourth insulating structure 400 are lower than the 35 kV steady current of the first insulating structure 100 which is a reference. Therefore, the third insulating structure 300 and the fourth insulating structure 400 are effective when focusing on the steady current flowing between the electrodes at the time of voltage application.

From the above, the second insulating structure 200 to the fourth insulating structure 400 described above are effective as an insulating structure of the anode and the cathode. The materials, sizes, shapes, and the like of the anode, the cathode, and the insulator may be appropriately changed within a range in which the object can be achieved depending on how much discharge is to be suppressed. In particular, since the anode is away from the CTJ and its shape has a large influence on the discharge characteristics, the degree of freedom is high.

Hereinafter, a configuration example of an electrostatic lens using the second insulating structure 200 to the fourth insulating structure 400 will be described.

Figure 10A:
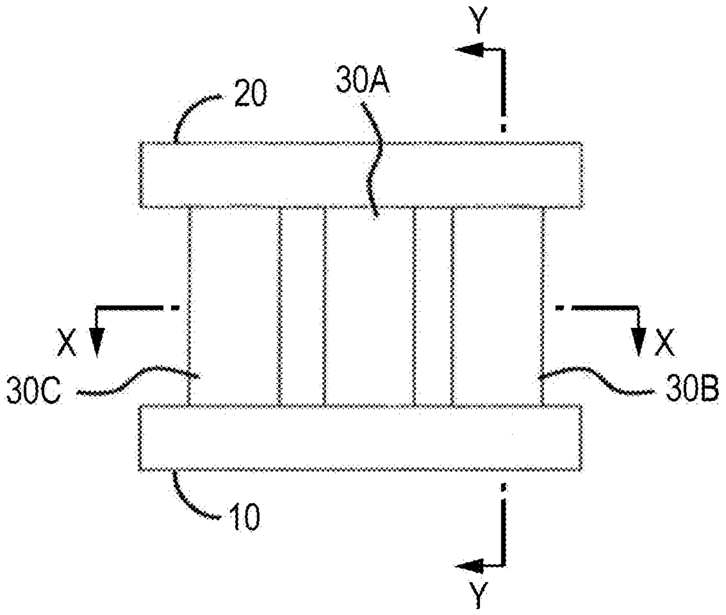
FIG. 10A is a schematic side diagram of an electrostatic lens.
Figure 10B:
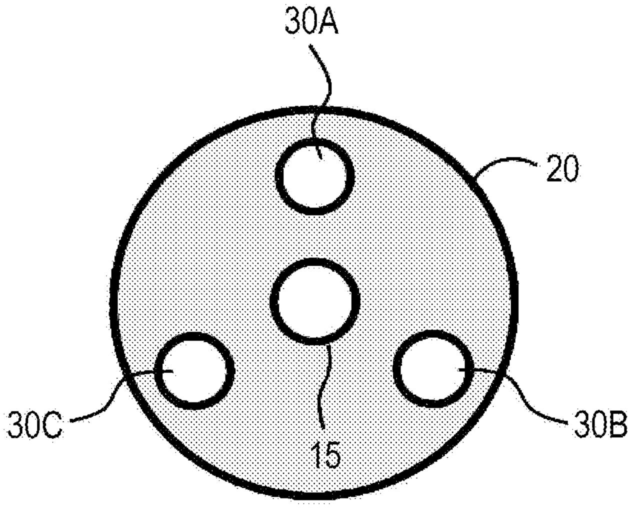
FIG. 10B is a diagram of the electrostatic lens of FIG. 10A as viewed downward from an X-X cross section.

FIGS. 10A and 10B are a schematic side diagram of the electrostatic lens and a diagram as viewed downward from an X-X cross section thereof, respectively. The electrostatic lens includes an anode 10 and a cathode 20. A relatively high voltage is applied to the anode 10, and a relatively low voltage is applied to the cathode 20. The difference between the voltage applied to the anode 10 and the voltage applied to the cathode 20 is, for example, 20 kV. The anode 10 and the cathode 20 function as an electrostatic lens with respect to a charged particle beam (for example, an electron beam).

The anode 10 and the cathode 20 are circular with a diameter of about 100 mm. A hole 15 having a diameter of about 10 mm is formed substantially at the center of the anode 10 and the cathode 20, and the charged particle beam passes through the hole 15. Then, columnar insulators 30A to 30C each having a diameter of about 10 mm are disposed in a 0:00 direction, a 4:00 direction, and an 8:00 direction of the clock around the hole 15.

The anode 10, the cathode 20, and the insulator 30A form an insulating structure. Similarly, an insulating structure is formed by the anode 10, the cathode 20, and an insulator 30B. The anode 10, the cathode 20, and an insulator 30C form an insulating structure.

Figure 11:
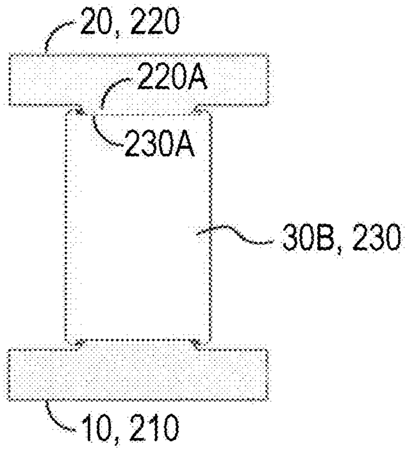
FIG. 11 is a cross-sectional diagram taken along line Y-Y in a case where the second insulating structure is applied to the electrostatic lens of FIGS. 10A and 10B.

FIG. 11 is a cross-sectional diagram taken along line Y-Y in a case where the second insulating structure 200 is applied to the electrostatic lens of FIGS. 10A and 10B. As illustrated, the second insulating structure 200 (see FIGS. 4A and 4B) in which the convex portion 220A formed in the cathode 20 (220) is fitted into the concave portion 230A formed in the insulator 30 (230) is applied.

Figure 12:
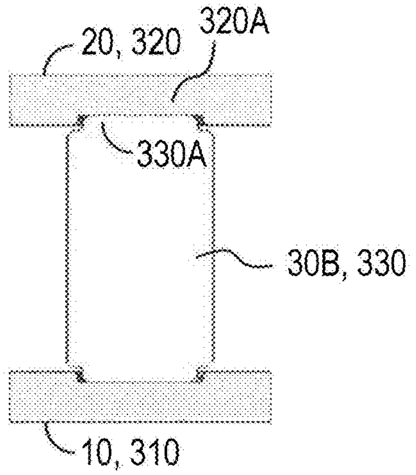
FIG. 12 is a cross-sectional diagram taken along line Y-Y in a case where the third insulating structure is applied to the electrostatic lens of FIGS. 10A and 10B.

FIG. 12 is a cross-sectional diagram taken along line Y-Y in a case where the third insulating structure 300 is applied to the electrostatic lens of FIGS. 10A and 10B. As illustrated, the third insulating structure 300 (see FIGS. 5A and 5B) is applied in which the convex portion 330A formed in the insulator 30 (330) is fitted into the concave portion 320A formed in the cathode 20 (320).

Figure 13:
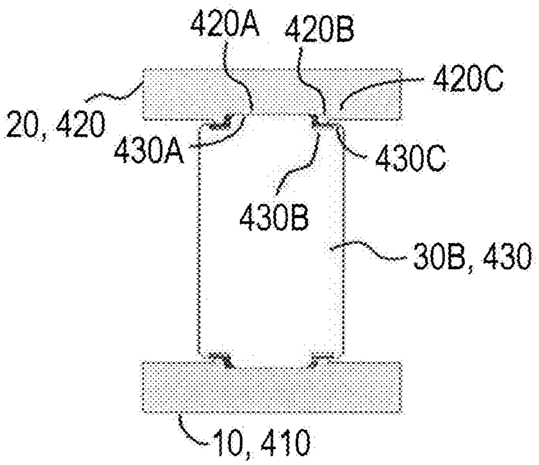
FIG. 13 is a cross-sectional diagram taken along line Y-Y in a case where the fourth insulating structure is applied to the electrostatic lens of FIGS. 10A and 10B.

FIG. 13 is a cross-sectional diagram taken along line Y-Y in a case where the fourth insulating structure 400 is applied to the electrostatic lens of FIGS. 10A and 10B. As illustrated, the fourth insulating structure 400 (FIGS. 6A and 6B) is applied in which the convex portion 430A formed in the insulator 30 (430) is fitted in the concave portion 420A formed in the cathode 20 (420), and the convex portion 420B formed in the cathode 20 (420) protrudes toward the concave portion 430B formed in the insulator 30 (430).

In FIGS. 11 to 13, each anode 10 has the same shape as the cathode 20 (that is, vertically symmetrical), but the anode 10 may be flat.

Figure 14A:
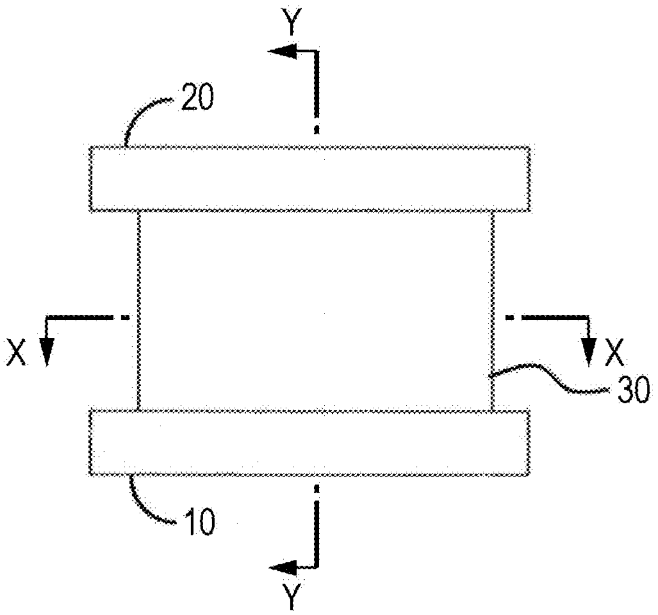
FIG. 14A is a schematic side diagram of another electrostatic lens.
Figure 14B:
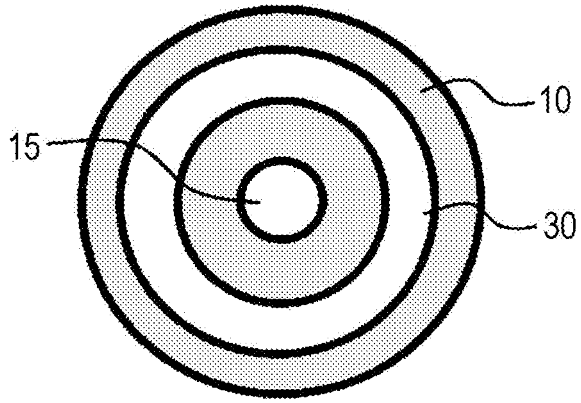
FIG. 14B is a diagram of the electrostatic lens of FIG. 14A as viewed downward from an X-X cross section.

FIGS. 14A and 14B are a schematic side diagram of another electrostatic lens and a diagram as viewed downward from an X-X cross section thereof, respectively. Hereinafter, differences from the electrostatic lens of FIGS. 10A and 10B will be described. The insulator 30 has a cylindrical shape, and its central axis is located at a position passing through the center of the hole 15. An outer peripheral surface of the insulator 30 has a diameter of about 90 mm, and an inner peripheral surface has a diameter of about 80 mm.

In order to improve the degree of vacuum in the vicinity of the hole 15, about 2 to 100 through-holes having a diameter of about 5 mm to 30 mm may be formed on the side surface of the insulator 30. A similar through-hole may be provided in the anode 10 or the cathode 20.

Figure 15:
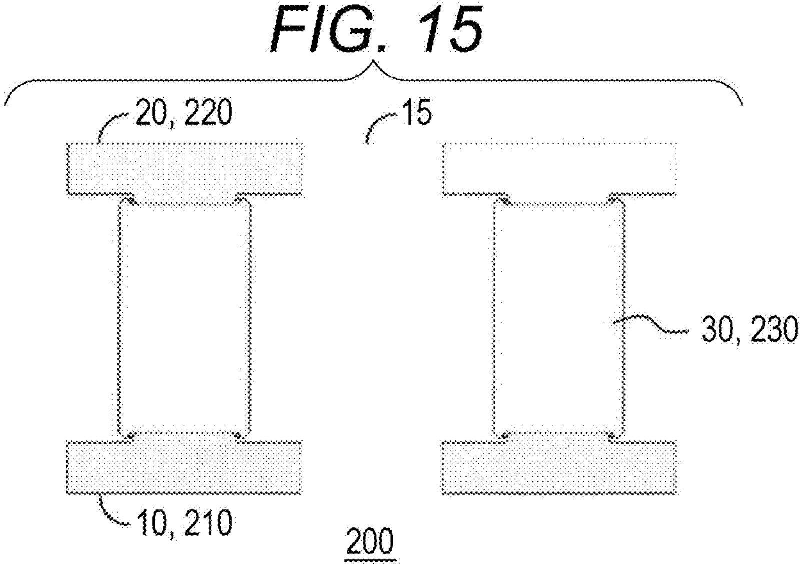
FIG. 15 is a cross-sectional diagram taken along line Y-Y in a case where the second insulating structure is applied to the electrostatic lens of FIGS. 14A and 14B.
Figure 16:
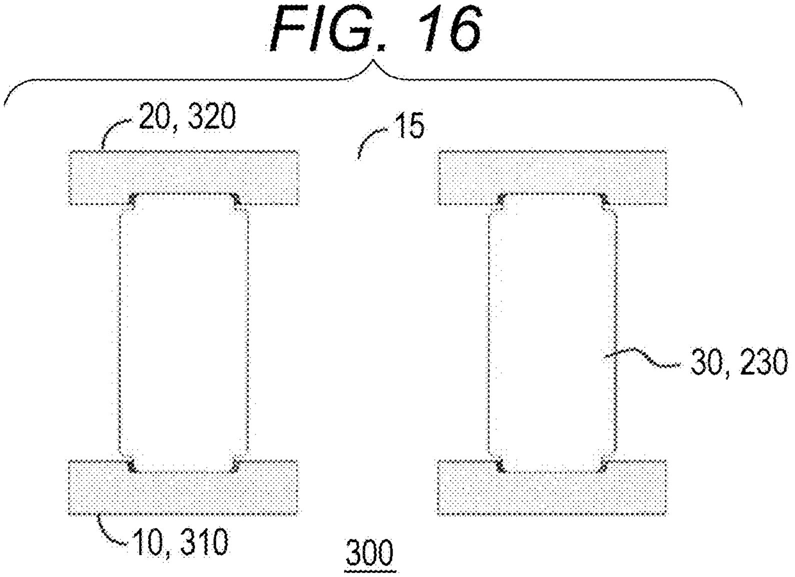
FIG. 16 is a cross-sectional diagram taken along line Y-Y in a case where the third insulating structure is applied to the electrostatic lens of FIGS. 14A and 14B.
Figure 17:
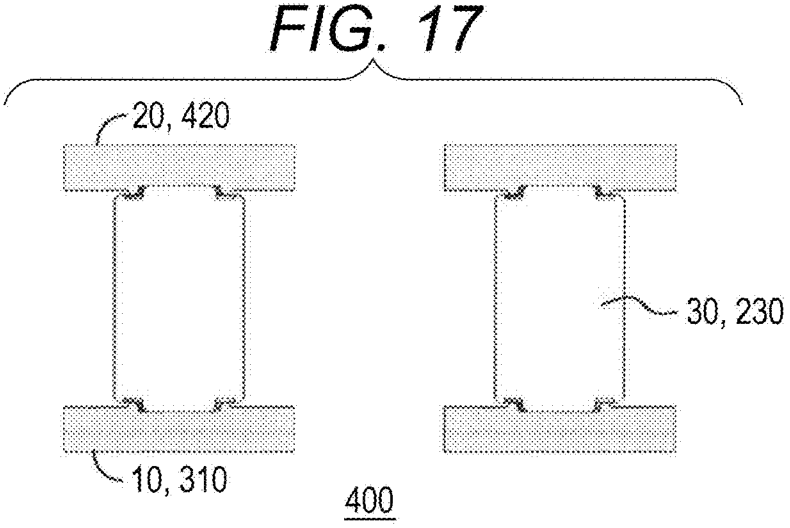
FIG. 17 is a cross-sectional diagram taken along line Y-Y in a case where the fourth insulating structure is applied to the electrostatic lens of FIGS. 14A and 14B.

FIG. 15 is a cross-sectional diagram taken along line Y-Y in a case where the second insulating structure 200 is applied to the electrostatic lens of FIGS. 14A and 14B. FIG. 16 is a cross-sectional diagram taken along line Y-Y in a case where the third insulating structure 300 is applied to the electrostatic lens of FIGS. 14A and 14B. FIG. 17 is a cross-sectional diagram taken along line Y-Y in a case where the fourth insulating structure 400 is applied to the electrostatic lens of FIGS. 14A and 14B. In FIGS. 15 to 17, each anode 10 has the same shape as the cathode 20 (that is, vertically symmetrical), but the anode 10 may be flat.

By using the electrostatic lens to which the second insulating structure 200 to the fourth insulating structure 400 as described above are applied in the charged particle beam device, it is possible to suppress discharge and to suppress deterioration in resolution of an electron image or analysis.

Note that the second insulating structure 200 to the fourth insulating structure 400 described above can also be applied to other devices. In addition, the electrostatic lens described above can be applied to any charged particle beam device (for example, a scanning electron microscope (SEM), a transmission electron microscope (TEM), an electron beam drawing device, an electron probe micro analyzer (EPMA), and a focused ion beam (FIB) device), and can also be applied to other devices.

Based on the above description, a person skilled in the art may be able to conceive additional effects and various modifications of the present invention, but aspects of the present invention are not limited to the individual embodiments described above. Various additions, modifications, and partial deletions can be made without departing from the conceptual idea and spirit of the present invention derived from the contents defined in the claims and equivalents thereof.

For example, those described as one member in the present specification (including those drawn as one member in the drawings) may be realized by a plurality of members. Conversely, those described as a plurality of members in the present specification (including those drawn as a plurality of members in the drawings) may be realized by one member.

In addition, not all the matters described in the present specification are essential requirements. In particular, matters described in the present specification and not described in the claims can be regarded as arbitrary additional matters.

It should be noted that the applicant of the present invention is merely aware of the invention disclosed in JP H8-124514 A, and the present invention is not necessarily intended to solve the problem in the invention disclosed in JP H8-124514 A. The problem to be solved by the present invention should be recognized in consideration of the entire specification. For example, in the present specification, in a case where there is a description that a predetermined effect is exhibited by a specific configuration, it can be said that the problem of reversing the predetermined effect is solved. However, such a specific configuration is not necessarily an essential requirement.

DESCRIPTION OF REFERENCE NUMERALS

1 Primary optical system
11 Electron source
12 Multiple beam generation mechanism
13 Transfer lens
14 Beam separator
15 Objective lens
16 Stage
17 Scan deflector
2 Secondary optical system
21 Beam bender
27 Projection lens
28 Detector
281 Scintillator
282 Optical amplifier
283 Image sensor
284 Magnifying lens
285 Half mirror
100 First insulating structure
110 Anode
111 Flat surface
120 Cathode
121 Flat surface
130 Insulator
130' Nickel plating
131, 132 Flat surface
133 Connection surface
200 Second insulating structure
210 Anode
211 Flat surface
220 Cathode
220A Convex portion
221, 222 Flat surface
223 Connection surface
230 Insulator
230' Nickel plating
230A Concave portion
230B Protruding portion
231 to 233 Flat surface
234, 235 Connection surface
300 Third insulating structure
310 Anode
311 Flat surface
320 Cathode
320A Concave portion
320B Protruding portion
321, 322 Flat surface
323 Connection surface
330 Insulator
330' Nickel plating
330A Convex portion
331 to 333 Flat surface
334, 335 Connection surface
400 Fourth insulating structure
410 Anode
411 Flat surface
420 Cathode
420A Concave portion
420B Convex portion
420C Concave portion
421 to 423 Flat surface
424, 425 Connection surface
430 Insulator
430' Nickel plating
430A Convex portion
430B Concave portion
430C Protruding portion
431 to 434 Flat surface
435 to 437 Connection surface
10 Anode
20 Cathode
30 Insulator

What is claimed is:

1. An insulating structure used in a vacuum for a charged particle beam device, the insulating structure comprising:

an anode; a cathode facing the anode; and an insulator disposed between the anode and the cathode, wherein the anode has an anode flat surface in contact with the insulator, the cathode has:

a first cathode flat surface that is substantially parallel to the anode flat surface and has a first distance from the anode flat surface;

a second cathode flat surface that is substantially parallel to the anode flat surface, and has a second distance from the anode flat surface, the second distance being smaller than the first distance; and a cathode connection surface that connects the first cathode flat surface and the second cathode flat surface, and the insulator has:

a first insulator flat surface in contact with the anode flat surface;

a second insulator flat surface in contact with the first cathode flat surface between the anode flat surface and the first cathode flat surface;

a third insulator flat surface between the anode flat surface and the second cathode flat surface, having a third distance from the anode flat surface, the third distance being smaller than the second distance, and not in contact with the second cathode flat surface;

a first insulator connection surface that connects the second insulator flat surface and the third insulator flat surface but is not in contact with the cathode; and a second insulator connection surface located inside an outer peripheral end of the anode and an outer peripheral end of the cathode and connecting the first insulator flat surface and the third insulator flat surface.

2. The insulating structure according to claim 1, wherein the insulator is made of PEEK.

3. The insulating structure according to claim 1, wherein at least a part of a surface of the insulator in contact with the anode is metallized.

4. An electrostatic lens comprising: the insulating structure according to claim 1.

5. A charged particle beam device comprising: the electrostatic lens according to claim 1.

6. The insulating structure according to claim 1, wherein the third insulator flat surface is flat from the first insulator connection surface to the second insulator connection surface.

7. An insulating structure used in a vacuum for a charged particle beam device, the insulating structure comprising:

an anode; a cathode facing the anode; and an insulator disposed between the anode and the cathode, wherein the insulator has:

an insulator flat surface; and an insulator convex portion protruding from the insulator flat surface, the cathode has:

a cathode flat surface; and a cathode concave portion which is recessed from the cathode flat surface and into which the insulator convex portion is fitted;

the insulator flat surface and the cathode flat surface are not in contact with each other; and an outer surface of the insulator convex portion and an inner surface of the cathode concave portion are not in contact with each other.

8. An insulating structure used in a vacuum for a charged particle beam device, the insulating structure comprising:

an anode; a cathode facing the anode; and an insulator disposed between the anode and the cathode, wherein the anode has an anode flat surface in contact with the insulator, the cathode has:

a first cathode flat surface that is substantially parallel to the anode flat surface and has a first distance from the anode flat surface;

a second cathode flat surface that is substantially parallel to the anode flat surface and has a second distance from the anode flat surface, the second distance being smaller than the first distance;

a third cathode flat surface that is substantially parallel to the anode flat surface and has a third distance from the anode flat surface, the third distance being smaller than the first distance and larger than the second distance;

a first cathode connection surface connecting the first cathode flat surface and the second cathode flat surface; and a second cathode connection surface connecting the second cathode flat surface and the third cathode flat surface, and the insulator has:

a first insulator flat surface in contact with the anode flat surface;

a second insulator flat surface in contact with the first cathode flat surface between the anode flat surface and the first cathode flat surface;

a third insulator flat surface between the anode flat surface and the second cathode flat surface, having a fourth distance from the anode flat surface, the fourth distance being smaller than the second distance, and not in contact with the second cathode flat surface;

a fourth insulator flat surface between the anode flat surface and the third cathode flat surface, having a fifth distance from the anode flat surface, the fifth distance being smaller than the third distance, and not in contact with the third cathode flat surface;

a first insulator connection surface that connects the second insulator flat surface and the third insulator flat surface but is not in contact with the cathode;

a second insulator connection surface that connects the third insulator flat surface and the fourth insulator flat surface but is not in contact with the cathode; and a third insulator connection surface located inside an outer peripheral end of the anode and an outer peripheral end of the cathode and connecting the first insulator flat surface and the fourth insulator flat surface.

9. An insulating structure used in a vacuum for a charged particle beam device, the insulating structure comprising:

an anode; a cathode facing the anode; and an insulator disposed between the anode and the cathode, wherein the cathode has:

a cathode concave portion; and a cathode convex portion provided on an outer side of the cathode concave portion, the insulator has:

an insulator convex portion;

an insulator concave portion provided on an outer side of the insulator convex portion; and an insulator protruding portion provided on an outer side of the insulator concave portion, the insulator convex portion protrudes toward the cathode concave portion, and a top surface of the insulator convex portion is in contact with a bottom surface of the cathode concave portion, the cathode convex portion protrudes toward the insulator concave portion but is not in contact with the insulator, and the insulator convex portion protrudes toward the cathode but is not in contact with the cathode.

10. An insulating structure used in a vacuum for a charged particle beam device, the insulating structure comprising:

an anode; a cathode facing the anode; and an insulator disposed between the anode and the cathode, wherein the anode has an anode flat surface in contact with the insulator, the cathode has:

a first cathode flat surface that is substantially parallel to the anode flat surface and has a first distance from the anode flat surface;

a second cathode flat surface that is substantially parallel to the anode flat surface and has a second distance from the anode flat surface, the second distance being larger than the first distance; and a cathode connection surface that connects the first cathode flat surface and the second cathode flat surface, and the insulator has:

a first insulator flat surface in contact with the anode flat surface;

a second insulator flat surface in contact with the first cathode flat surface between the anode flat surface and the first cathode flat surface;

a third insulator flat surface between the anode flat surface and the second cathode flat surface, having a third distance from the anode flat surface, the third distance being larger than the first distance and smaller than the second distance, and not in contact with the second cathode flat surface;

a first insulator connection surface that connects the second insulator flat surface and the third insulator flat surface but is not in contact with the cathode; and a second insulator connection surface located inside an outer peripheral end of the anode and an outer peripheral end of the cathode and connecting the first insulator flat surface and the third insulator flat surface.

11. An insulating structure used in a vacuum for a charged particle beam device, the insulating structure comprising:

an anode; a cathode facing the anode; and an insulator disposed between the anode and the cathode, wherein the cathode has:

a cathode flat surface; and a cathode convex portion protruding from the cathode flat surface, the insulator has:

an insulator flat surface; and an insulator concave portion that is recessed from the insulator flat surface and into which the cathode convex portion is fitted, the cathode flat surface and the insulator flat surface are not in contact with each other, and an outer surface of the cathode convex portion and an inner surface of the insulator concave portion are not in contact with each other.

* * * * *